United States Patent [19]

Oleske

[11] Patent Number: 4,816,086

[45] Date of Patent: Mar. 28, 1989

[54] COMPOSITIONS USEFUL IN COPPER OXIDATION, AND A METHOD TO PREPARE COPPER OXIDATION SOLUTIONS

[75] Inventor: Peter J. Oleske, Landisville, Pa.

[73] Assignee: Armstrong World Industries, Inc., Lancaster, Pa.

[21] Appl. No.: 185,710

[22] Filed: Apr. 25, 1988

[51] Int. Cl.$^4$ ............................................. C23C 22/00
[52] U.S. Cl. .................................. 148/247; 148/259; 148/260

[56] References Cited

U.S. PATENT DOCUMENTS 2,457,480 12/1948 Lewis ............................ 148/6.14 R
2,460,898 2/1949 Meyer ................................ 148/6.14
4,623,738 11/1986 Sugerman ............................ 556/17

Primary Examiner—Sam Silverberg

[57] ABSTRACT

Tetra-substituted zirconate or titanate organophosphate or organopyrophosphate coupling agents are combined with an alkali metal phosphate salt and a chlorite salt in an aqueous solution useful for copper oxidation. The concentration of the alkali metal phosphate salt in the aqueous solution must be 2.5 times higher than the titanate or zirconate coupling agent. A process for the preparation of superior compositions is also described wherein the coupling agent can not be mixed in an aqueous solution with the chlorite salt unless the alkali metal phosphate salt is present in the solution also.

20 Claims, No Drawings

COMPOSITIONS USEFUL IN COPPER OXIDATION, AND A METHOD TO PREPARE COPPER OXIDATION SOLUTIONS

BACKGROUND OF THE INVENTION

Field of the Invention

Multi-layered printed circuit boards involve the use of layers of copper and polymeric dielectric material. These multi-layered circuit boards are in great demand for use in complex electronic devices.

For good serviceability, it is necessary that the circutized copper layer(s) adhere to the polymeric dielectric material. This adhesion, however, is often a commonly found point of failure for those products. Various methods have been used to improve adhesion.

Many of the methods used to improve adhesion put an oxide coating on the copper, improving adhesion between the copper and the polymeric dielectric layer. For example, U.S. Pat. No. 2,460,896 describes a composition for forming a copper oxide coating on copper; the composition including sodium or potassium chlorite nd an alkyli metal hydroxide. These two materials are used in relative proportions within the range of about one part chlorite per part of hydroxide to one part chlorite for each 200 parts of the hydroxide.

The adhesion provided by such early oxide coatings, however, was inferior. The first oxides, usually black and velvety in appearance, would provide a surface having marginal adhesive performance. The long dentrites of the coatings were easily crushed during lamination and frequently resulted in lower bond strengths between the copper and dielectric material when compared to multi-layered boards having no oxide coating.

More recently developed oxide coatings and coating materials are described in U.S. Pat. No. 4,409,037 which describes a composition and process for improving the adhesion of copper foil to polymeric printed circuit substrates. The composition comprises an aqueous solution containing an alkali metal chlorite or alkaline earth metal chlorite in a concentration of at least 100 grams per liter along with sodium or potassium hydroxide at a concentration in the range of from 5 to 25 grams per liter. The solution is then maintained at a temperature of from 80° to 200° F. while contacting the copper foil to deposit the oxide layer. Another reference, U.S. Pat. No. 4,512,818 describes additives which can be used in solutions for the formation of oxide coatings. The additives control various properties of the oxide coating and improve the ability to bond copper to dielectric substrates. The additives used are soluable polymers dissolved in the solution in a minor amount. The additives reduce the formation of the oxide coating in thickness and produce greater homogeniety. The coatings are further described as being mechanically dense and strong in that they do not fracture when mechanically rubbed to yield loose granular black copper oxide powder as do the coatings in the prior art. The additives are used in the solution in an amount between 3 and 100 parts per million parts of solution.

Although improvements have been made since these early compositions allowing the production of more reliable oxide coatings, adherence between the copper and dielectric polymeric material continues to be a problem. Certain polymeric substrates such as polyimide have been particularily difficult to use due to low copper-polymer bond strength.

Furthermore, delamination and untimely failure of printed wiring boards still occurs. It is therefore highly desirable to provide oxide coatings for copper which are capable of delivering improved adhesion of the copper to the dielectric material. It is also desirable to extend the life of a printed wiring board by providing an oxide coating which will reduce delamination.

A composition is described which can be used to give copper an oxide coating in order to improve adhesion between the dielectric material and the copper. Improved adhesion to polyimide has been particularily noted. When the instant composition is used, it has been found that adhesion of the copper to the dielectric material is excellent and the bond is capable of extending the useful life of the multi-layer composite produced. In addition to this, the instant coating improves the stability of the cu/polymer bond and makes it less vulnerable to thermal stresses.

BRIEF DESCRIPTION OF THE INVENTION

A composition which has been found useful for the oxidation of copper surfaces is an aqueous solution of: component A—a chlorite salt; component B—an alkali metal phosphate salt; component C—a coupling agent which is a tetra-substituted zirconate or titanate, organophosphate or organopyrophosphate ester. This coupling agent can be: (1) selected from an alkoxyphosphatoalkoxyzirconate, an alkoxyphosphatozirconate, an alkoxypyrophosphatozirconate and an alkoxypyrophosphatoalkoxyzirconate or (2) selected from an alkoxyphosphatotitanate, alkoxyphosphatoalkoxytitanate, an alkoxypyrophosphatotitanate, and an alkoxypyrophosphatoalkoxytitinate.

This composition is desireably maintained as a master solution. A master solution is an aqueous solution of components A, B and C. These solutions are used as a storage source from which the actual oxidation solution (a "working solution") is prepared by adding base and heating to a temperature desired for oxidation. Preferably, a master solution is stored at a concentration much higher than will be needed or desired for oxidation so that the master solution can be used in small amounts as needed. To prepare the working solution from concentrated master solutions, a selected amount of strong base can be added along with an amount of water.

The term "working solution" is used herein to refer to the copper oxidation solution which is actually used to oxidize the copper surface. The working solutions will, in addition to components A, B and C, also contain component D, a strong base. Usually the base selected will be an alkali metal hydroxide.

It has been found that copper surfaces that have been oxidized with the instant compositions have a superior bond strength when compared to the performances of other copper surfaces oxidized with other solutions containing different coupling agents.

Surprisingly, even better performance can be obtained if the instant compositions are prepared by a method which comprises: combining components A, B and C with water to form an aqueous solution containing components A, B and C, provided however, that the components are combined in a manner characterized in that component C is permitted to be in the solution with component A only if component B is also present. This means that either component C or a solution of component C is added to a solution with component A in it only if component B is in solution with either A or C. This does permit a number of sequences to be used.

Component B, for example, could be combined in solution with component A, or with component C in a solution or it could be added to separate aqueous solutions of component A and component C. In the latter case, to provide the instant compositions, the separate solutions would then be combined with each other to form one solution containing all three components.

Although a copper oxidation solution could be obtained by combining first component A and then component C followed by the addition of component B, it has been found that superior performance is obtained if the components are combined in accordance with the described method. Not only does this method provide a copper oxide having superior capabilities, but it has also been found that by using this method, copper oxidation solutions can be prepared which are stable at the higher concentrations of the component C coupling agent. Thus, although it is possible to prepare a copper oxidation solution by combining the three components in any sequence, if the instant method is used a solution can be made which is more concentrated in the coupling agent and superior performance can be expected in the working solution. If this method is not followed, then phase separation will be encountered with higher concentrations of component C and poorer performance will be given by all of the oxidation solutions.

DETAILED DESCRIPTION

Three main ingredients are required in order to prepare solutions of the instant invention. The first ingredient, component A, is a chlorite salt. This includes both the hypochlorites and the chlorites. Preferred salts are formed from the alkali and alkaline earth metals. Most preferably, component A is selected from the group consisting of: sodium hypochlorite, sodium chlorite, potassium chlorite and potassium hypochlorite.

The instant compositions also require component B, an alkali metal phosphate salt. To obtain oxidation, the alkali metal phosphate salt should be used at a concentration which is at least about 2.5 times the concentration of the component C coupling agent. (The concentration ratio of component B:component C is at least about 2.5.) Preferably, the alkali metal is selected from the group consisting of: sodium and potassium.

The third ingredient is component C, a coupling agent which, as previously indicated, can be: (1) a tetra-substituted organophosphate or pyrophosphate zirconate ester or (2) a tetra-substituted organophosphate or pyrophosphate titanate ester. While it is permissible to use a mixture of (1) and (2) for the coupling agent, there is no advantage obtained from doing so. Almost to the contrary, it has been noted that when a selected zirconium salt is mixed with a selected titanium salt to be used as the component C coupling agent, the performance obtained is no better than the performance which would be obtained from the salts if the most highly concentrated salt was used alone. For example, if one did mix the titanium and the zirconium salts using each in a low concentration which would improve the copper-substrate bond in only a small amount, then, combining the two will still give only that small improvement, and this improvement could be obtained by using only one of the salts alone. Using both together is therefore a waste. Component C should be either a titanium or a zirconium salt.

These organophosphato and organopyrophosphato titanate and zirconate coupling agents can be obtained commercially. Furthermore, for a description of suitable preparation methods and of the compounds, reference can be made to sources such as: U.S. Pat. Nos. 4,623,738, 4,634,785 and 4,600,789.

The alkoxy moieties of these coupling agents can be represented as —O—R. These alkoxy groups are found in the compound substituted onto the metal and phosphorous atoms. Specifically, the organic portion (—R) is a hydrocarbon moiety which can be linear, branched and cyclic, saturated, unsaturated and aromatic, and optionally these said hydrocarbon moieties can include a substituent selected from the group consisting of nitrogen, oxygen and a halogen. Nitrogen substituents will preferably be found forming amine groups, and the oxygen is preferably found as carboxyl, ether, and ester groups. There can be from 1 to 62 carbon atoms per hydrocarbon moiety but preferably there are from 1 to 30 carbon atoms. The coupling agents can also be found with added phosphine or sulfonate adduct moieties which are added onto the coupling agent by using a phosphonic or sulfonic acid; these adducts help improve solubility.

It should be noted that these coupling agents should be used in liquid form. Frequently, therefore these compounds are used as adducts or with the oxygen halogen or nitrogen atoms in the alkoxy group. Preferred groups include an amine or amine adduct forming an amine salt which helps solubalize the coupling agent. The solubility of these coupling agents is thus increased by forming an adduct between the coupling agent and, in preferred cases, an amine, a phosphonic or a sulfonic acid, or by using the compounds that have alkoxy groups with a member selected from: oxygen, a halogen and nitrogen.

In preferred embodiments, the component C coupling agent can be a compound represented by the formulas under FIGS. 1-7 which follow. FIGS. 1-5 show a formula for a tetra-substituted alkoxypyrophosphatoalkoxytitanate or zirconate coupling agent; FIG. 6 shows a formula for a tetra-substituted alkoxypyrophosphatozirconate or titanate coupling agent; and FIG. 7 shows a formula for an alkoxyphosphatoalkoxytitanate or zirconate.

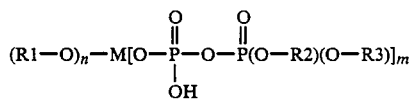

FIG. 1

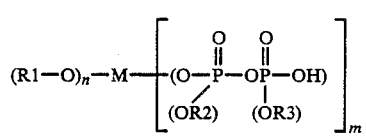

FIG. 2

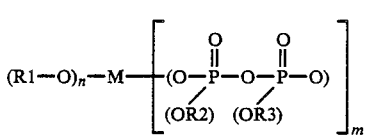

FIG. 3

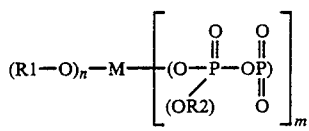

FIG. 4

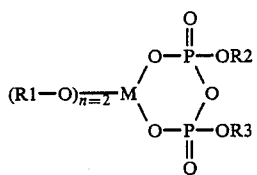

FIG. 5

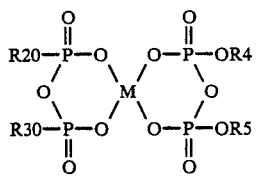

FIG. 6

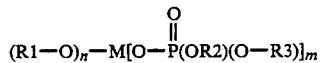

FIG. 7

In the formulas shown under FIGS. 1–7: M is either titanium or zirconium, m is either 2 or 3, n is 1 or 2 (except that in FIG. 5, n is 2), and m+n=4. R1, R2, R3, R4 and R5 are saturated, unsaturated or aromatic hydrocarbon moieties which can be branched, cyclic, and linear. It should be understood that when n is 2 (in FIGS. 1–5 and 7 above), than R1 could be one hydrocarbon group substituted onto the metal M through two different oxygen atoms. This single hydrocarbon group could be cyclic or a complex hydrocarbon having a crosslinking or bridging atom or moiety. In such cases where n is 2 and R1 represents a single hydrocarbon moiety, there will be at least two carbon atoms in the group; acceptably in these cases R1 can have from 2 to 62 carbon atoms.

In the other cases, when n is 2 and there are two separate R1 groups then each R1 can be identical or can be different and can have from 1 to 62 carbon atoms.

It is likewise permissible for R2 and R3 and R4 and R5 to be one hydrocarbon group. This single group could be cyclic, or, as indicated before, connected by a crosslinking or bridging atom or moiety. In such cases, R2 and R3 together will have at least two carbon atoms, the number of carbon atoms in such a single group, therefore, can range from 2 to 62. All of R1, R2, R3, R4 and R5 can include substituents selected from the group consisting of nitrogen, oxygen and a halogen. Preferbly, they will have a maximum of 30 carbon atoms per oxygen linkage onto the M metal; most preferably, there are a maximum of 15 carbon atoms per oxygen linkage onto M or P; and most preferably, the hydrocarbon portion of R1–R5 are branched or linear, saturated or unsaturated hydrocarbons.

Some preferred titanate coupling agents can be selected from: titanium IV alkoxy, tri(dialkyl) pyrophosphato-O; titanium IV oxoalkylenediolato bis(dialkyl) pyrophosphato-O; titanium IV oxoalkylenediolato bis(dialkyl) pyrophosphato-O, adduct with (dialkyl) hydrogenphosphite-O; titanium IV alkyldiolato bis(dialkyl)pyrophosphato-O; titanium IV alkyldioato bis(dialkyl)pyrophosphato-O adduct with (dialkyl) hydrogenphosphite-O; titanium IV alkylenediolato bis(dialkyl)pyrophosphato-O; titanium IV alkylenediolato bis(dialkyl)phosphato-O; titanium IV oxoalkylenediolato bis(dialkyl)phosphato-O; titanium IV oxoalkylenediolato bis(dialkyl)phosphato-O, adduct with (dialkyl) hydrogenphosphite-O; titanium IV alkyldiolato bis(dialkyl)phosphato-O; titanium IV alkyldiolato bis(dialkyl)phosphato-O, adduct with (dialkyl) hydrogenphosphite-O; titanium IV oxoalkylenediolato, bis(dialkyl)pyrophosphato-O, adduct with dialkylaminoalkanol; titanium IV alkylenediolato bis(dialkyl)pyrophosphato-O, adduct with (dialkyl) hydrogenphosphite-O; titanium IV alkylenediolato bis(dialkyl)pyrophosphate-O, adduct with bis(trialkyl)amine salt; titanium IV alkylenediolato bis(dialkyl)pyrophosphato-O, adduct with bis-dialkylaminoalkanoate; titanium IV alkylene diolato bis(dialkyl)pyrophosphato-O, adduct with alkylamidoalkylamine; titanium IV alkylenediolato bis(dialkyl)phosphato-O, adduct with (dialkyl) hydrogenphosphite-O; titanium IV alkylenediolato bis(dialkyl)phosphato-O, adduct with bis(trialkyl)amine salt; titanium IV aklylenediolato, bis(dialkyl)phosphato-O, adduct with bis(dialkyl)amino alkanoate; titanium IV alkylene diolatobis(dialkyl)pyrophosphato-O, adduct with alkylamidoalkylamine; titanium IV alkoxy, tri(dialkyl) phosphato-O; titanium IV bisalkanolato cyclo(dialkyl)phosphato-O; titanium IV bisalkanolato cyclo(dialkyl)pyrophosphato-O; titanium IV (bisalkanolatoalkyl)alkanolato, tris(dialkyl)phosphato-O; titanium IV (bisalkanolatoalkyl)alkanolato, tris(dialkyl)pyrophosphato-O; titanium IV bis cyclo(dialkyl)pyrophosphato-O; titanium IV biscyclo(dialkyl)phosphato-O,O; titanium IV (bisalkanolatoalkyl)alkanolato, bis(dialkyl)pyrophosphato; titanium IV (bisalkanolatoalkyl)alkanolato, bis(dialkyl)pyrophosphato, adduct with alkylamino alkylamide, titanium IV (bis alkanolatoalkyl)alkanolato, bis(dialkyl)phosphato-O; and titanium IV (bis alkanolatoalkyl)alkanolato bis(dialkyl)phosphato-O, adduct with alkylamino alkylamide.

Some preferred zirconium coupling agents can be selected from: zirconium IV alkoxy, tri(dialkyl) pyrophosphato-O; zirconium IV oxoalkylenediolato bis(dialkyl) pyrophosphato-O; zirconium IV oxoalkylenediolato bis(dialkyl) pyrophosphato-O, adduct with (dialkyl) hydrogenphosphite-O; zirconium IV alkyldiolato bis(dialkyl)pyrophosphato-O; zirconium IV alkyldioato bis(dialkyl)pyrophosphato-O, adduct with (dialkyl) hydrogenphosphite-O; zirconium IV alkylenediolato bis(dialkyl)pyrophosphato-O; zirconium IV alkylenediolato bis(dialkyl)phosphato-O; zirconium IV oxoalkylenediolato bis(dialkyl)phosphato-O; zirconium IV oxoalkylenediolato bis(dialkyl)phosphato-O, adduct with (dialkyl) hydrogenphosphite-O; zirconium IV alkyldiolato bis(dialkyl)phosphato-O; zirconium IV alkyldiolato bis(dialkyl)phosphato-O, adduct with (dialkyl) hydrogenphosphite-O; zirconium IV oxoalkylenediolato, bis(dialkyl)pyrophosphato-O, adduct with dialkylaminoalkanol; zirconium IV alkylenediolato bis(dialkyl)pyrophosphato-O, adduct with (dialkyl) hydrogenphosphite-O; titanium IV alkylenediolato bis(dialkyl)pyrophosphate-O, adduct with bis(trialkyl)amine salt; zirconium IV alkylenediolato bis(dialkyl)pyrophosphato-O, adduct with bisdialkylaminoalkanoate; zirconium IV alkylene diolato bis(dialkyl)pyrophosphato-O, adduct with alkylamidoalkylamine; zirconium IV alkylenediolato bis(dialkyl)phosphato-O, adduct with (dialkyl) hydrogenphosphite-O; zirconium IV alkylenediolato bis(dialkyl)phosphato-O, adduct with bis(trialkyl)amine salt; zirconium IV aklylenediolato, bis(dialkyl)phosphato-O, adduct with bis(dialkyl)amino alkanoate; zirconium IV alkylene diolatobis(dialkyl)pyrophosphato-O, adduct with alkylamidoalkylamine; zirconium IV alkoxy, tri(dialkyl) phosphato-O; zirconium IV bisalkanolato cyclo(dialkyl)phosphato-O; zirconium IV bisalkanolato cyclo(dialkyl)pyrophosphato-O; zirconium IV (bisalkanolatoalkyl)alkanolato, tris(dialkyl)phosphato-O; zirconium IV (bisalkanolatoalkyl) alkanolato, tris(dialkyl)pyrophosphato-O; zirconium IV bis cyclo(dialkyl)pyrophosphato-O; zirconium IV bis cyclo(dialkyl)phosphato-O,O; zirconium IV (bisalkanolatoalkyl)alkanolato, bis(dialkyl)pyrophosphato; zirconium IV (bisalkanolatoalkyl)alkanolato, bis(dialkyl)pyrophosphato, adduct with alkylamino alkylamide; zirconium IV (bis alkanolatoalkyl)alkanolato, bis(dialkyl)phosphato-O; and zirconium IV (bis alkanolatoalkyl)alkanolato bis(dialkyl)phosphato-O, adduct with alkylamino alkylamide.

Most preferably in the above titanium and zirconium groups, the hydrocarbon moieties indicated above, (such as the aklylene, oxyalkyene, alkyl, dialkyl and alkoxy) will have from 1 to 15 carbon atoms. These hydrocarbon moieties, for example, will include moieties such as methyl, ethyl, propyl, butyl, pentyl, hexyl, heptyl, octyl, etc.)

Representative examples of preferred titanate coupling agents are:

Titanium IV (bis-2-propenolato-methyl)-1-butanolato, bis(dioctyl)pyrophosphato-O, (adduct) 3 moles N,N-dimethylamino-alkylpropenoamide;

Titanium IV 2,2(bis-2-propenolatomethyl)butanolato, tris(dioctyl)phosphato-O;

Titanium IV bis octanolato, cyclo(dioctyl)pyrophosphato-O,O;

Titanium IV biscyclo(dioctyl)pyrophosphato-O,O;

Titanium IV 2-propanolato, tris(dioctyl)pyrophosphato-O;

Titanium IV bis(dioctyl)phosphato-O, ethylenediolato; and

Titanium IV 2,2(bis-2-propenolatomethyl)butanolato, tris(dioctyl)pyrophosphato-O.

Representative examples of preferred zirconate coupling agents are:

Zirconium IV 2,2-dimethyl 1,3-propanediolato, bis(dioctyl)pyrophosphato-O, (adduct) 2 moles N,N-dimethylamino-alkylpropenoamide, Zirconium IV (2-ethyl,2-propenolatomethyl)1,3-propanediolato, cyclo bis 2-dimethylamino pyrophosphato-O,O adduct with 2 moles of methanesulfonic acid, Zirconium IV 2,2(bis-2-propenolatomethyl)butanolato, tris(dioctyl)phosphato-O, and Zirconium IV 2,2(bis-2-propenolatomethyl)butanolato, tris(dioctylpyrophospato-O.

To obtain a better oxide coating, the instant mixing procedure is used. If desired, one could mix the chlorite salt, the alkali metal phosphate salt and/or the coupling agent with a portion of water before combining the components with each other. Alternatively, any of these components could be added directly to the solution. If the components are in solid form when they are combined in a solution, however, care should be taken especially to allow the alkali metal phosphate salt to dissolve so that it is effective before the component A chlorite salt and the component C coupling agent are combined in the same solution.

When preparing either the master or working solutions using the instant mixing procedure, the alkali metal phosphate salt (component B) should be present in an amount which is a minimum of about 2.5 times the concentration selected for component C. If this minimum amount of alkali metal phosphate salt is not in the solution when the component C coupling agent is combined with component A, then no additional amount of phosphate salt will be effective to cause the formation of an oxidizing one phase solution with the coupling agent.

It has also been found that for superior performance, this minimum concentration ratio of 2.5:1 for component B:component C preferably gives the working solution a certain minimum absolute amount in grams per liter of the phosphate salt. This preferred minimum is different for each type of metal and also for the black as opposed to the red and brown oxide color. The preferred minimum absolute amount of the component B phosphate is about 3 g/l if a brown or red oxide is desired, and the coupling agent is a zirconium; for brown or red, it is about 0.3 g/l for the titanate agent; about 1 g/l for the black oxide with a zirconium agent, and about 0.1 g/l if the black oxide is desired when a titanate agent is used.

If the alkali metal phosphate salt is used in an amount which is 2.5 times the concentration of the component C coupling agent, but has a lower than minimal absolute amount per liter, then oxidation will occur, but the copper oxide coating obtained will not be as good. To illustrate this point, reference can be made to Example 10 which does show the formation of a copper oxide coat with the B:C concentration ratio of 4:1. Since the absolute amount of B, however, was only 2 grams/liter, the oxide coating did not give excellent performance. Excellent performance can be noted in other examples such as Example 11.

The chlorite salt selected for component A should be used at a concentration which is at least about seven times the concentration level of the phosphate salt. If the ratio of component A to component B is less than 7:1, then the working solutions will give oxide coatings which are operational but non-uniform and are inferior.

The individual component concentration in the premixed master solution, at its highest point, is naturally the amount which will no longer be dissolved in the solution. Conveniently, the concentration levels of each component can be maintained within a concentration range at which each component is easily dissolved. An acceptable premixed master solution can, for example, be prepared easily with the chlorite salt at a concentration in the range of from about 275 grams per liter (g/l) to about 15 g/l; and the phosphate salt at a concentration at least 2.5 times the concentration of the coupling agent, and at a point in the range of from about 0.5 g/l to about 25 g/l (preferably, from about 1.5 to 25 g/l); the zirconium coupling agent is at a concentration of from about 0.0125 to about 12.5 g/l; for a titanate coupling agent, the concentration level is from about 0.00125 to about 2 g/l.

While the concentrations of each component can vary considerably, a zirconium coupling agent can suitably be present at a minimum concentration of about 0.0125 grams per liter (g/l) and for titanium, suitably, a minimum of about 0.00125 to provide solutions acceptable for use or dilution and use.

When a working solution is used to contact the copper surfaces for oxidation, it is normally more dilute than a concentrated master solution which is used for convenient storage. When preparing a working solution directly, a strong base will be added at any desired point in the sequence to maintain a basic pH during oxidation. While any strong base can be used, the preferred bases are alkali metal hydroxides. Most preferably, the bases selected from potassium hydroxide and sodium hydroxide, of these two the most preferred, is sodium hydroxide.

In using the instant copper oxidation solutions, the degree of oxidation and the resulting color of the copper oxide can be varied by altering the concentration of base and the temperature of the solution used. While it is permissible to use oxidation conditions already described in the art, the following conditions are recommended for the instant compositions. To get (1) a black copper oxide surface, the temperature of the working solution is from about 80° to about 105° C., while the concentration of base (hydroxide) is from 10 to about 20 g/l; (2) to get a brown copper oxide coating, the temperature preferably is from about 60° to about 75° C., while the concentration of base is from about 9 to about 16 g/l; and (3) to get a red copper oxide surface, the temperature is preferably from about 50° to about 65° C., while the concentration of base is from about 2 to about 8 g/l.

The various degrees of oxidation that show the three different oxide colors, are obtained largely by controlling the temperature and hydroxide concentration as indicated above. Variation of the concentration levels of components A, B and C will not have a very large effect on the degree of oxidation. The concentration levels of components A, B and C, however, can be adjusted as described herein to optimize the performance obtained from the oxide coating produced.

In order to further optimize performance of the oxide coated surface, the component concentrations can preferably be set at levels that are preferred for the specific color of copper oxide coating desired. Therefore, the chlorite is preferably at a concentration of from about 20 to about 45 g/l in a working solution especially recommended for the black oxide coating; and at a concentration in the range of from about 75 to 150 g/l recommended for the red or brown oxide coatings. The alkali metal phosphate salt preferably is at a concentration in the range of from about 1 to about 10 g/l in working solutions used to obtain the black oxide coating and is at a concentration in the range of from about 3.75 to about 15 g/l for the red or brown oxide coatings.

The peak performance of the zirconate and titanate coupling agents for working solutions of the instant compositions has also been found to be at different concentration levels for each metal in addition to having slightly different optimum performance levels for the different oxide coats. Thus, organophosphate and the organopyrophosphate zirconate coupling agents preferably are used in working solutions at a concentration in the range of from about 0.05 to about 1.5 g/l for the black oxide coating; and at a concentration in the range of from about 0.05 to about 2.5 g/l for the red or brown oxide coatings. The organophosphate and the organopyrophosphate titanate coupling agents are preferably used in working solutions at a concentration of from about 0.005 to about 1 g/l for the red or brown oxide coatings, and a preferred concentration of from about 0.005 to about 0.5 g/l for the black oxide coatings.

When the method of solution preparation described herein is used to prepare either a premixed master solution or a working solution, overall a superior performance is noted in the copper oxide surface prepared. Even better performance is obtained, however, when the preferred concentration levels described above are used with the solutions prepared in accordance with the instant method. When preparing the master solution, if the optimum performance of the working solution is also desired, the components of the master solutions should be maintained at concentration levels or ratios which will allow the addition of base or base and water to obtain the working solution having components A, B and C at the previously indicated concentration levels needed for the color of oxide desired.

Master solutions that are more concentrated than needed may be "let down" (diluted) to the concentration desired for the particular working solution needed. This dilution can be accomplished by the addition of a basic aqueous solution which contains the correct amount of water needed to dilute the master solution to the proper point. The presence of base in the solution will conveniently maintain the proper pH for the working solution. Alternatively, the desired amount of master solution can be combined with a basic aqueous solution which contains the amount of base needed for the working solution. The mixture can later be combined with the balance of the water needed to produce the working solution having the correct concentration for the type of oxidation desired.

Copper surfaces are oxidized in order to increase the bond strength of the copper to desired substrates. The most typical substrates are formed by placing resins on woven fabrics. Typical fabrics used are glass weaves. The most common substrates found are polyester, polyimide, and epoxy resins. Usually these resins are used on a glass weave. More preferred substrates have the polyimide or epoxy surface. Of these, the most preferred is the epoxy since this particular substrate surface allows the strongest bond strength. Although the polyimide surfaced substrate is found frequently, this type of surface is particularly difficult to achieve a good bond strength. A pull strength of 1 to 2-½ pounds per linear inch of width has been found in the art to be a good bond strength for a polyimide surfaced substrate.

EXAMPLE 1

Two highly concentrated master solutions useful in copper oxidation were prepared. The solutions were prepared so that the ingredients had the specific concentrations indicated in Tables I and II. Solution II was then used in Examples 2–4 with the specified amount of base and deionized water added for the solutions used to oxidize the copper.

Preparation of Solution I

One concentrated master solution was prepared by mixing 18 grams of trisodium phosphate and 1.225 grams of zirconium IV 2,2-dimethyl 1,3-propanediolato, bis(dioctyl)pyrophosphato-O, (adduct) 2 moles N,N-dimethylamino-alkyl propenoamide from Kenrich Petro Chemicals (LZ38J) with 50 grams of water. This solution was then added to an aqueous solution which contained 250 g of sodium chlorite deionized water was then added to make a one liter volume.

Table I for Solution I

| Components | Concentration |
| --- | --- |
| A Sodium chlorite | 250 g/l |
| B Trisodium phosphate | 18 g/l |
| C The pyrophosphozirconate | 1.225 g/l |

Although the solution was substantially clear, a slight haze was noted. The solution was therefore filtered to remove the haze. Filtering the solution resulted in the collection of a small amount of a white soapy precipitate. While not wanting to be bound by theory, in all probability this precipitate is a phosphate soap formed with the reaction of the phosphated materials. This precipitate forms when the component B phosphate salt is combined with the component B coupling agent and appears to form over the broad range of concentration levels used. It is furthermore substantiated that the precipitate does not effect the performance of the oxidation solution. Oxidation can be accomplished with equal results, both with and without the precipitate. Removal of the precipitate is, therefore, mainly cosmetic. Since, however, the point of the instant test was to substantiate the stability of the solutions over periods of time, complete removal of the precipitate was performed. It is also noted that removal of the precipitate can be accomplished either with the decantation or filtration. In the instant example filtration was conducted after the chlorite was added, but this does not necessarily have to be the case. Filtration is an optional step which can also be conducted after the zirconate and phosphate salts are combined but before component A is added.

After filtration, the solution was given a careful visual examination. It was noted tht the solution was clear and slightly yellowish in color.

The solution was then placed in a glass bottle and sealed. This vessel was then placed in a room generally maintained at a temperature in the range of from about 23° to 26° C. The vessel containing the solution remained in the room for ten months. At the end of this time, the solution was observed to have the same appearance previously described in the preceeding paragraph.

Preparation of Solution II

Concentrated master solution II was prepared by mixing 18 grams of trisodium phosphate and 1.225 grams of Zirconium IV 2,2-dimethyl 1,3-propanediolato, bis(dioctyl)pyrophosphato-O (adduct) 2 moles N,N dimethylamino-alkyl propenoamide from Kenrich Petro Chemicals (LZ-38J). This solution was then added to an aqueous solution of deionized water which contained 250 grams (g) of sodium chlorite. The solution was filtered and deionized water was added to make a one liter volume.

Table II for Solution II

| Components | Concentration |
| --- | --- |
| A Sodium chlorite | 250 g |
| B Trisodium phosphate | 18 g |
| C The selected pyrophosphozirconate | 1.225 |

The solution was given a careful visual examination. It was noted that the solution was clear and slightly yellowish in color. This solution was then used to prepare the oxidation solutions needed for Examples 2-4. To prepare these oxidation solutions, small amounts of solution II were removed over a period of about two months. Solution II was therefore repeatedly exposed to the air. At the end of this time, it was noted that the appearance of solution II did not change, it remained clear with a yellowish color.

Copper Surface Preparation

The copper surfaces for oxidation were prepared according to the following procedure. (All of the examples herein used one ounce copper foil.)

The copper surface was degreased by rinsing with acetone, and was then immersed in a solution of 5% sulfuric acid for two minutes followed by rinsing in water. The surface was then etched with an etchant marketed by Chemline Industries (Etch-Prep). Etching was completed after the immersion in the etchant at room temperature for two minutes. After etching, the copper was rinsed with water.

The copper prepared in accordance with this description is hereinafter called "surface-prepped".

Copper Oxidation Procedure

The surface-prepped coupons (pieces) of copper were placed in the oxidizing solution having the selected temperature. The coupons were permitted to sit in this oxidizing bath at the selected temperature for a period of four (4) minutes. The coupons were then removed from the bath, rinsed in water and air dried.

The surface oxidized copper coupons were then ready to be used or to be tested as is described in the following examples.

EXAMPLE 2

For this example, the oxidizing solution was prepared by combining 100 milliliters (ml.) of Solution II, 3.125 g. of NaOH, and enough deionized water to bring the working solution volume to 250 ml. For this example, the temperature of the solution during copper oxidation (hereinafter called the "oxidizing temperature") was 150° F.

The resulting copper oxide coating was examined visually. It was noted that the oxide was brown in color and was covering the copper surface uniformly giving the entire surface a uniform, rich brown coating.

Adhesion Tape Test

The copper oxide coating prepared in this example and in examples which follow (as indicated), were given an adhesion tape test to test the adhesion of the oxide to the copper substrate. This adhesion test was conducted as follows:

A pressure-sensitive transparent adhesive tape was pressed firmly onto the oxide surface so that about 1 to 2 inches of the tape is on the oxide. Then, in a single motion the tape was peeled off. The tape is then visually examined with the naked eye. The tape was particularily examined to see if any of the oxide coating stuck to the tape. The presence or absence of oxide particles was noted for each test. The tape was then placed in a laboratory notebook where the example was recorded. The same brand of tape was used for all of these examples. (3M Scotch brand transparent tape can be used.)

For Example 2, it was noted that the copper oxide was not taken off by the tape. No oxide particles were found on the adhesive tape. In fact, it was noted that instead that the tape's adhesive was taken off of the cellophane and stayed stuck on the oxide.

EXAMPLE 3

Using the procedure as described in Example 2, another oxidation solution was prepared using Solution II. In this example, 100 ml. of Solution II was mixed with 1.25 g. of NaOH and enough deionized water to give a 250 Ml. copper oxidation solution. The copper coupon was oxidized at 135° F. for four minutes. The resulting oxide coating was red in color (also called bronze or tan). It was also noted that the coating was also evenly distributed and uniform in texture on the copper surface.

This red oxide coating was also given the adhesion test. No oxide particles were found on the tape, and instead adhesive from the tape remained on the copper oxide.

EXAMPLE 4

Using the procedure as described in Example 2, another oxidation solution was prepared also using Solution II. For this example, 35 ml. of Solution II was combined with 4.125 g. of NaOH (sodium hydroxide). Deionized water was added to obtain a 250 ml. copper oxidation solution.

For this example, the copper coupon was oxidized at 195° F. for four minutes. The resulting oxide coating was black in color. It was also noted that the coating was evenly distributed and uniform in texture.

The black oxide coating was also given the adhesion test. No oxide particles were found on the tape and instead, adhesive from the tape remained on the copper oxide.

COMPARATIVE EXAMPLES

Examples 5 and 6, which follow, illustrate the importance of maintaining the ratio of the concentration of alkali phosphate:coupling agent at a level in excess of about 2.5:1. The solution prepared for Examples 5 and 6 had a phosphate:zirconate concentration ratio of only 1.63:1. These examples demonstrate that this ratio is too low to produce any oxide at all. This contrasts with both the previous examples and Examples 7-9 which showed that a solution having a phosphate:zirconate ratio of 3.6:1 can be used to give an excellent oxide coating.

SOLUTION PREPARATION FOR EXAMPLES 5 & 6

Following the procedure described for the preparation of Solution II under Example 1, a concentrated solution was prepared for use in Examples 5 and 6. The ingredients and the concentration of these ingredients in the solution are given in the Table below.

TABLE III

| Components | Concentration |
| --- | --- |
| (A) Sodium Chlorite | 250 g/l. |
| (B) Tri-Sodium Phosphate | 2 g/l. |
| (C) Zirconium IV 2,2-dimethyl 1,3-propane-diolato, bis(dioctyl)pyrophosphat-O, (adduct) 2 moles N,N—dimethylaminoalkyl propenoamide | 1.225 g/l. |

EXAMPLE 5

A 100 ml. portion of the solution described in Table III is mixed with 3.125 g. of NaOH and deionized water to obtain a 250 ml. working solution. The solution was used to try to oxidize a surface-prepped coupon of copper at 150° F. for a period of four minutes.

It was noted that no oxide coating had formed on the copper. During the entire four minutes, no oxidation had occurred.

EXAMPLE 6

A 100 ml. portion of the solution prepared under Table III was added to 3.125 g. of NaOH and deionized water to provide a 250 ml. oxidation solution. An additional amount of trisodium phosphate was added to this 250 ml. working solution in an attempt to obtain a solution which would oxidize; 3.25 g. of trisodium phosphate was added.

A surface-prepped coupon of copper foil was placed in this solution at 150° F. for four minutes.

Again, as was seen under Example 5, the copper coupon was not oxidized.

SOLUTION PREPARATION FOR EXAMPLES 7-9

According to the procedure described for the preparation of Solution II under Example 1, another solution was prepared for use with the experiments described in Examples 7-9. The components selected and the concentrations of the components in this solution are described below under Table IV.

TABLE IV

| Components | Concentration |
| --- | --- |
| (A) Sodium Chlorite | 250 g/l. |
| (B) Tri-Sodium Phosphate | 9 g/l. |
| (C) Zirconium IV 2,2-dimethyl 1,3-propanediolato, bis(dioctyl) pyrophosphato-O, (adduct) 2 moles N,N—dimethylamino-alkyl propenoamide | 2.5 g/l. |

EXAMPLE 7

Using the procedure described in Example 2, a working solution was prepared using 100 ml. of the solution described under Table IV. 3.125 g. of sodium hydroxide and deionized water were added to prepare the 250 ml. working solution.

A surface-prepped coupon of copper foil was placed in this working solution at a temperature of 150° F. for four minutes. As was found for Example 2, a brown oxide coating had formed uniformly on the copper.

An adhesion tape test was performed on the copper oxide surface. As is described in Example 2, no detectable amount of oxide was transferred onto the tape, instead, visible amounts of adhesive remained stuck on the brown copper oxide coating.

It was further noted that the brown oxide coating had formed on the copper foil surface in a uniform density. Thus, the texture and color of the oxide were uniform across the entire oxidized surface of the copper cupon.

EXAMPLE 8

100 ml. of the solution described under Table IV were mixed with 1.25 g. of sodium hydroxide and enough deionized water to provide a 250 ml. solution. A surface-prepped cupon of copper was then oxidized in this solution for four minutes at 135° F. An oxide coating formed on the surface which can be described as red or bronze in color. It was further noted this oxide coating had also formed on the surface uniformly. Therefore, the color and texture of the coating could be described as uniform across the entire surface of the copper foil.

The adhesion tape test was performed on this copper foil. As was described previously under Example 2, no visible copper oxide was seen on the transparent tape. Furthermore, it was also noted that some of the adhesive from the transparent tape had instead become stuck on the copper oxide coating.

EXAMPLE 9

A 35 ml. portion of the solution described in Table IV was mixed with 4.125 g. of sodium hydroxide and enough deionized water to provide a 250 ml. working solution. Oxidation was performed on a surface-prepped coupon of copper foil at at temperature of 195° F. for a period of four minutes.

A black oxide coating formed on the copper coupon surface. It was also noted that this black oxide coating had formed uniformly across the copper surface and could be described as uniform in both color and texture.

The adhesion tape test was performed on this black oxide coating. Again, it was noted that there was no visible oxide on the tape after it had been removed. Instead, adhesive from the tape was noted on the surface of the copper oxide.

SOLUTION FOR EXAMPLES 10-11

Using the process described for the preparation of Solution II under Example 1, a solution was prepared having the components and concentrations indicated under Table V below.

TABLE V

| Components | Concentration |
| --- | --- |
| (A) Sodium Chlorite | 250 g/l. |
| (B) Tri-Sodium Phosphate | 5 g/l. |
| (C) Zirconium IV 2,2-dimethyl 1,3-propanediolato, bis(dioctyl) pyrophosphato-O, (adduct) 2 moles N,N—dimethylamino-alkyl propenoamide | 1.25 g/l. |

As has been previously indicated, excellent oxide coatings will form for a black oxide coating if the working solution has a minimum absolute amount of phosphate component B of at least about 1 g. per liter; for the red and brown oxide coatings, there should be at least about 3 g. of phosphate per liter for the formation of the preferred oxide coating. If the alkali metal phosphate salt (component B) is at a level lower than these amounts, the oxide coating produced will not perform as well. Care should therefore be taken in using the master solutions if a preferred oxide coating is desired. Too much dilution will form a solution producing only acceptable or only marginally acceptable oxide coatings.

EXAMPLE 10

Using the process described for the preparation of the working solution for Example 2, a 100 ml. portion of the solution described under Table V was combined with 3.125 g of sodium hydroxide and a sufficient amount of deionized water to provide a 250 ml. working solution. The working solution thus prepared for this example only contained an absolute amount of trisodium phosphate in the amount of 2 g. per liter to demonstrate the formation of an oxide coating which was only acceptable. The oxidation conditions were selected to get a brown oxide coating. Therefore, a surface-prepped coupon of copper was placed in this 250 ml. working solution at a temperature of 150° F. for four minutes. An oxide coating did form on the coupon.

It was noted that the oxide coating which formed was brown in color. Visual examination of the copper oxide coating, however, revealed that the coating was not uniform on the copper surface. Instead, the coating appeared to be less dense in some areas than in others. The color of the brown was therefore not uniform in density or texture across the surface of the copper. The copper oxide surface could therefore be described as a mottled brown.

This mottled brown oxide coating was given the adhesion tape test. Some brown discoloration was observed on the back of the tape indicating that some of the oxide remained stuck to the adhesive tape.

While such an oxide coating could be used and would to an extent improve adherence to a substrate, a better coating and better performance could be obtained from a solution which was not diluted as much.

EXAMPLE 11

This example demonstrates that a preferred working solution giving preferred performance can be obtained from the solution prepared under Example 10 if the amount of alkali metal phosphate salt is increased in the diluted working solution. Accordingly, 3.25 g. of trisodium phosphate were added to the working solutions identical to those as described in Example 10. Thus, the absolute concentration of trisodium phosphate in the working solution was increased from 2 g. per liter to an absolute amount of 5.25 g. of trisodium phosphate. This solution was then used to oxidize a surface-prepped coupon of copper under the same conditions as is described in Example 10. A brown oxide coating formed on the coupon.

It was noted that this brown copper oxide coating was uniform in color and texture on the surface of the copper coupon.

This copper coupon was also given the adhesion tape test. As was found for Example 2, it was noted that there was no brown discoloration on the transparent tape after it had been removed from the coupon. It was furthermore noted that instead adhesive from the tape had transferred onto the brown oxide coating.

This example is also significant in that it shows that additional amounts of component B can be added to a working solution which has been accidentially diluted too much so that it does not give superior performance.

This example is also significant in comparison to Examples 5 and 6. Under Example 6, it was not possible to obtain oxidation merely by adding additional amounts of the alkali metal phosphate salt. In that example, there was an inadequate amount of alkali metal phosphate salt to begin with, i.e., the ratio of component B to component C was only 1.63:1. In Example 6, with the inadequate amount of component B present when component A was added, no additional amounts of component B could be added in order to obtain oxidation performance. The instant example, however, demonstrates a case where there were sufficient quantities of component B initially when the solution was prepared although too much water was added in dilution so that the working solution had a low absolute amount per liter. This could easily be remedied by the addition of component B to the diluted working solution in order to increase the performance of the solution and obtain a better oxide coating.

COMPARATIVE EXAMPLE 12

The following illustrates a copper oxidation solution which is not in accordance with the instant invention. A solution was prepared for the oxidation of copper. The table below shows the amount of grams of the specified ingredient which was added to one liter of water.

TABLE VI

| First Ingredients | Amounts |
|---|---|
| 12.5% Sodium Hypochlorite Solution | 100 ml. |
| Sodium Hydroxide | 70 g. |
| Trisodium Phosphate | 1.2 |

A surface-prepped copper coupon was then oxidized with the working solution.

A portion of the working solution previously described was heated to 165° F. and the copper coupon was immersed in this working oxidation solution for four minutes.

The copper surface had an oxide coating which was brown and in appearance was fairly uniform in the texture and density of the oxide coating over the surface of the copper.

An adhesion tape test was performed. It was apparent that a brown film of oxide particles adhered to the tape so that the tape had a dark cast to it. This experiment was then recorded and the tape placed on the reported record for purposes of preservation and comparison.

EXAMPLE 13

This example is noteworthy, both for comparison to Example 12 and since, as a process variation, sodium hydroxide was added to the oxidizing solution before the coupling agent.

A working solution for copper oxidation was prepared in accordance with the instant invention. In preparing the solution, a solution of sodium hypochlorite was combined with sodium hydroxide and trisodium phosphate. A coupling agent was then added. The solution is described in Table VII. The coupling agent was Zirconium IV 2,2-dimethyl 1,3 propanediolato, bis(dioctyl)pyrophosphato-O (adduct) 2 moles N,N-dimethylamino-alkyl propenoamide (Kenrich Petro Chemical-LZ-38J).

TABLE VII

| Components | Concentration |
|---|---|
| (A) 12.5% Sodium Hypochlorite solution | 100 g./l |
| (B) Trisodium Phosphate | 1.25 g./l |
| (C) Coupling Agent | 0.7 g./l |
| (D) Sodium Hydroxide | 70 g./l |

A surface-prepped copper coupon was oxidized in this solution for four minutes at 165° F. It was noted that the coupon had a brown oxide coating which appeared to be uniformly distributed on the copper. The coating was then given an adhesion tape test in the manner described under Example 2 and no oxide particles were found on the tape. In fact, adhesive from the tape had transferred from the tape to the oxide coating.

This oxide coating was compared to the oxide coating obtained from the bath described in Example 12. It was noted that the coating made with the solution of Table VII appeared to be a darker tone of brown and the coating was more uniform. The darker tone of the brown implies a more cohesive and denser oxide structure than was seen under Example 12.

EXAMPLE 14

A solution was prepared following the procedure described in Example 13 except that the coupling agent used was Titanium IV 2,2(bis) 2-propenolatomethyl)-butanolato, tris(dioctyl)phosphato-O (from Kenrich Petro Chemicals-LICA-12). The composition of this working solution is described in Table VIII below.

TABLE VIII

| Components | Concentration |
|---|---|
| A 12.5% Sodium Hypochlorite solution | 100 g./l |
| B Trisodium Phosphate | 1.25 g./l |
| C Coupling Agent | 0.7 g./l |
| D Sodium Hydroxide | 70 g./l |

A surface-prepped coupon was placed in a portion of the solution described in Table VIII for four minutes at 165° C. It was noted that the surface had been oxidized and was brown in color. The oxide coating also appeared to be a darker tone of brown and was also more uniform than was produced under Example 12.

This darker color implies a more cohesive and denser oxide structure than was seen for Example 12.

The coating was given an adhesion tape test. It was significant that no oxide particles were found on the tape. Upon visual inspection, it was noted that adhesive of the tape in fact transferred from the tape to the oxide coating.

EXAMPLE 15

A solution was prepared following the procedure described in Example 13 except that the coupling agent used in Titanium IV 2,2(bis-2-propenolatomethyl)-butanolato, tris(dioctyl)phosphato-O (from Kenrich Petrol Chemicals-LICA-12). The composition of this working solution is described in the table below.

TABLE IX

| Components | Concentration |
|---|---|
| (A) 12.5% Sodium Hypochlorite solution | 100 ml/l |
| (B) Trisodium Phosphate | 1.25 g./l |
| (C) Coupling Agent | 0.35 g./l |
| (D) Sodium Hydroxide | 70 g./l |

This example also shows a variation in which sodium hydroxide was added to the oxidizing solution before the coupling agent. A surface-prepped copper coupon was placed in a portion of this solution described at a temperature of 165° C. After four minutes, the coupon was removed. The oxide coating was brown, but appeared to be a deeper brown in color and the coating was more uniform than was observed for the copper of Example 12.

The darker color implies a more cohesive and denser oxide structure than was seen in Example 12.

An adhesion tape test was performed in order to test the strength of the coating. It was significant that no oxide particles were found on the tape. Upon visual inspection, it was noted that adhesive of the tape in fact transferred from the tape to the oxide coating.

In the examples which follow, the strength of the bond between a substrate and the oxidized surface was tested using ASTM Standard Test D1867 10.01 for foil peel strength. In this way the adhesion of the oxidized copper to the selected dielectric substrate material was measured.

Polyimide Lamination Procedure

In preparation for this test, uniform pieces of copper foil measuring 8" (inches)×4"×1.4 mils were surface-prepped and then oxidized using the conditions specified under each example. The copper was then placed on the substrate so that the copper oxide surface rested on the substrate. A cure-stage followed in which the temperature was maintained at a desired level for a period of time while pressure was applied to press the copper and the substrate together. Thereafter, the sample was post-cured by heating it at a desired temperature for another time period. The specific conditions used for the cure-stage and the post-cure are given below for the polyimide substrate.

TABLE X

|  | Polyimide Substrate |
|---|---|
| (1) Cure-Stage | 400° F. at 300 psi for 4 hours |
| (2) Post-Cure | 410° F. for 4 hours |

(PSI—Pounds per square inch)

The polyimide substrates used were a B-staged polyimide having an impregnated, woven glass web. "B-staged" indicates that the polyimide was dried but not cured.

COMPARATIVE EXAMPLE 16

Preparation of Copper Foil

The oxidizing solution used for this example was prepared for the purposes of comparison with the solutions of the instant invention as can be noted from the table below. This comparative solution did not have any coupling agent.

TABLE XI

| Ingredients | Concentration |
|---|---|
| (A) Sodium Chlorite | 100 g/l |
| (B) Sodium Hydroxide | 12.5 g/l |
| (C) Trisodium Phosphate | 7 g/l |

A sample of one ounce copper foil measuring 8"×4"×1.4 mil was surface-prepped and oxidized for four minutes at 165° F. using a portion of the solution described in Table XI. A brown oxide surface was obtained using the previously described lamination procedure. The oxide was laminated to a polyimide substrate.

In accordance with ASTM Standard Test D1867 (10.01 foil peel test), the force required to pull the foil from the substrate at a 90° angle at a rate of one inch per minute was measured and is recorded below as the peel strength. The force required is recorded in units of pounds per inch of foil width.

The peel strength was 2.5 pounds per inch (lb/in).

It has also been found that if a post cure time was extended to in excess of four hours with oxidation solutions having no titanate or zirconate additives, then the peel strength dropped as low as 1 lb/in.

As can be seen from the following examples, however, the titanate and zirconate additives can give higher peel strength. The instant invention can also provide laminates that maintain this peel strength even with post cure time periods that are longer than four hours.

EXAMPLE 17

A copper oxidation solution of the instant invention was prepared using the procedure described in Example 13. The solution is described in Table XII.

TABLE XII

| Ingredients | Concentration |
|---|---|
| Sodium Chlorite | 100 g/l |
| Trisodium Phosphate | 7 g/l |
| Zirconium IV 2,2(bis-2-propenolatomethyl) butanoloto, tris(dioctyl)pyrophosphato-O | .5 g/l |
| Sodium Hydroxide | 12.5 g/l |

The zirconate coupling agent used was LZ-38 obtained from Kenrich Chemicals.

The solution was used to oxidize a surface-prepped piece of copper foil which was then laminated onto a substrate of B-staged polyimide that was identical to the polyimide of Example 16, using the previously described lamination procedure.

The instant sample was found to have a peel strength of 3.75 lb/in.

It is noteworthy that the peel strength of the foils prepared with the solutions of Table XII consistently gave peel strengths at 3.75 (50% higher than in Example 16).

It is also noteworthy that the instant solutions consistently provided peeling foil samples in which the resin itself was the failure phase. This was an internal shear of the substrate as opposed to the copper oxide bond failure shown in Example 16.

EXAMPLE 18

Using the procedure described in Example 13, a copper oxidation solution was prepared. The solution is described below in Table XIII.

TABLE XIII

| Ingredients | Concentration |
|---|---|
| Sodium Chlorite | 100 g/l |
| Sodium Hydroxide | 12.5 g/l |
| Trisodium Phosphate | 7 g/l |
| Titanium IV 2,2(bis 2-propenolatomethyl) butanolato, tris(dioctyl) phosphato-O | .05 g/l |

The titanate coupling agent used was LICA-12 obtained from Kenrich Chemicals.

The solution was used to oxidize a surface-prepped piece of copper foil which was then laminated onto substrate of B-staged polyimide that was identical to the polyimide of Example 16, using the previously described lamination procedure.

The instant sample was found to have a peel strength of 3.75 lb/in.

EXAMPLE 19

Another series of laminations were conducted to test the performance of the instant oxidation solutions when another type of substrate is used.

Accordingly, a solution was prepared in accordance with the mixing procedures described for solution 2 under Example 1. This solution had the composition given under Table XIV.

TABLE XIV

| Ingredients | Concentration |
|---|---|
| Sodium Hypochlorite | 160 ml. of a 12.5% solution |

TABLE XIV-continued

| Ingredients | Concentration |
|---|---|
| Tri Sodium Phosphate | 2.0 g/l |
| Zirconium IV 2,2-dimethyl 1,3 propanediolato, bis(dioctyl) pyrophosphato-O, (adduct) 2 moles N,N—dimethylamino-alkyl propenoamide | .20 g/l |
| Sodium Hydroxide | 70 g/l |

This solution was used to oxidize surface-prepped copper foil samples 20-23. These oxidations were conducted while holding the oxidation solutions at 150° F. for four minutes. The oxidation procedure previously described was generally used, and a brown oxide coat was produced.

Comparative samples A-D were oxidized under the same conditions using the comparative solution described in the table below. A brown oxide coating was produced. These samples serve to illustrate the superior performance obtained by using the instant compositions.

| Comparative Solution | |
|---|---|
| Ingredients | Concentration |
| Sodium Hypochlorite | 160 ml. of a 12.5% solution |
| Tri Sodium Phosphate | 2.0 g/l |
| Sodium Hydroxide | 70 g/l |

(l. = liter)

Samples 20-23 and A-D then were laminated onto a glass weave impregnated epoxy surface substrate.

Epoxy Lamination

All of the samples (20-23 and A-D) were laminated. For lamination, the copper was placed on the substrate so that the copper oxide surface rested on the substrate material. A cure-stage followed in which the temperature was maintained at a desired level for a period of time while pressure was applied. Thereafter, the sample was post-cured by heating it at a desired temperature for another period of time. The post-cure time varied for the samples within each series. The specific conditions used for this single phase epoxy lamination are given in the table below along with a listing of the specific samples and the specific post-cure time period which each sample was given.

TABLE

| Conditions for Single Phase Epoxy Lamination | |
|---|---|
| Stage | Conditions |
| Cure-Stage | 350° F. at 300 psi for one-half hour |
| Post-Cure | 300° F. for the time period indicated for each sample. |

The laminated samples were tested using ASTM Standard Test D-1867 foil peel 10.01 strength test. The strength of the bond between the substrate and the oxidized surfaces were measured and the results are listed below. While the adhesion of the oxidized copper to the epoxy dielectric substrate material is better, it is significant to note that the instant compositions provided an even more improved adherence. The strength of the bond between the copper oxide and the epoxy is given below in a peel value which indicates the number of pounds required to peel the copper foil for each linear width of the foil. Thus, the units specifically are pounds per linear inch (abbreviated lb/in).

| | Peel Value |
|---|---|
| Samples of Table XIV | |
| 20 (1 hr. cure) | 6.5 lb/in |
| 21 (2 hr. cure) | 6.5 lb/in |
| 22 (3 hr. cure) | 6.5 lb/in |
| 23 (4 hr. cure) | 6.25 lb/in |
| Comparative Samples | |
| A (1 hr. cure) | 6 lb/in |
| B (2 hr. cure) | 2.25 lb/in |
| C (3 hr. cure) | 2.0 lb/in |
| D (4 hr. cure) | 1.75 lb/in |

What is claimed is:

1. A method for the preparation of a composition useful for copper oxidation comprising: combining components (A) a chlorite salt, (B) an alkali metal phosphate salt, and (C) a coupling agent which (1) is a tetra-substituted zirconate selected from the group consisting of: an alkoxyphosphatozirconate, an alkoxyphosphatoalkoxyzirconate, an alkoxypyrophosphatozirconate, and an alkoxypyrophosphatoalkoxyzirconate, or (2) is a tetra-substituted titanate selected from the group consisting of: an alkoxyphosphatoalkoxytitanate, an alkoxyphosphatotitanate, an alkoxypyrophosphatoalkoxytitanate, and an alkoxypyrophosphatotitanate; with water to form a combined aqueous solution, provided, however, that components A, B and C are combined in a manner characterized in that when component C is combined with component A, then component B must first be in solution (1) with component A, or (2) with component C, or (3) with component A and with component C in separate solutions; further, providing that the combined aqueous solution has a concentration ratio for component B:component C of at least about 2.5:1.

2. A method as described in claim 1 wherein a base is also added when components A, B and C are combined.

3. A method as described in claim 1 wherein a base and water is then added to the combined aqueous solution.

4. A method as described in claim 1 wherein component A is at a concentration which is at least about 7 times greater than component B.

5. A method as described in claim 4 wherein the coupling agent is the tetra-substituted zirconate, which is precent in the combined aqueous solution at a concentration of at least about 0.0125 g/l.

6. A method as described in claim 4 wherein the coupling agent is the tetra-substituted titanate, which is present in the combined aqueous solution at a concentration of at least about 0.00125 g/l.

7. A composition comprising: an aqueous solution of component A, a chlorite salt; component B, an alkali metal phosphate salt; and component C, a coupling agent which (1) is a tetra-substituted zirconate ester selected from the group consisting of: an alkoxyphosphatoalkoxyzirconate, an alkoxyphosphatozirconate, an alkoxypyrophosphatozirconate, and an alkoxypyrophosphatoalkoxyzirconate, or (2) is a tetrasubstituted titanate ester selected from the group consisting of: an alkoxyphosphatoalkoxytitanate, an alkoxyphosphatotitanate, an alkoxypyrophosphatoalkoxytitanate, and an alkoxypyrophosphatotitanate; and wherein component B is at a concentration which is at least 2.5 times greater than component C.

8. A composition as described in claim 7 wherein component A is at a concentration which is at least about seven times greater than component B.

9. A composition as described in claim 7 which was prepared by combining A, B and C in a manner characterized in that when component C was combined in a solution with component A, component B was (1) already dissolved with component A, or was (2) already dissolved with component C, or was (3) already dissolved with both component A and component C.

10. A composition as described in claim 8 wherein the coupling agent is the tetra-substituted zirconate ester, which is present in the combined aqueous solution at a concentration of at least about 0.0125 g/l.

11. A composition as described in claim 8 wherein the coupling agent is the tetra-substituted titanate ester, which is present in the combined aqueous solution at a concentration of at least about 0.00125 g/l.

12. A composition as described in claim 7 wherein component A is selected from the group consisting of: sodium chlorite, potassium chlorite, potassium hypochlorite, and sodium hypochlorite.

13. A composition as described in claim 9 wherein the aqueous solution also contains a base.

14. A composition as described in claim 13 wherein the coupling agent is the tetra-substituted zirconate ester and the alkali metal phosphate salt is present at a concentration of at least about 1 g/l.

15. A composition as described in claim 13 wherein the coupling agent is the tetra-substituted titanate ester and the alkali metal phosphate salt is present at a concentration of at least about 0.1 g/l.

16. A composition as described in claim 14 wherein the coupling agent is present in the range of from about 0.05 to about 2.5 g/l.

17. A composition as described in claim 15 wherein the coupling agent is present in the range of from about 0.005 to about 1 g/l.

18. A composition comprising: an aqueous solution of component A, a chlorite salt; component B, an alkali metal phosphate salts; and component C, a coupling agent which (1) is a tetra-substituted zirconate ester at a minimum concentration of 0.0125 g/l and is selected from the group consisting of: an alkoxyphosphatoalkoxyzirconate, an alkoxyphosphatozirconate, an alkoxypyrophosphatozirconate, and an alkoxypyrophosphatoalkoxyzirconate or (2) is a tetra-substituted titanate ester at a minimum concentration of 0.00125 g/l and is selected from the group consisting of: an alkoxyphosphatoalkoxytitanate, an alkoxyphosphatotitanate, an alkoxypyrophosphatoalkoxytitanate, and an alkoxypyrophosphatotitanate; wherein component B is at a concentration which is at least about 2.5 times greater than component C, and further providing that this composition was prepared by combining A, B and C in a manner characterized in that when component C was combined in a solution with component A, component B was, (1) already dissolved with component A, or was (2) already dissolved with component C, or was (3) already dissolved with both component A and component C.

19. A composition as described in claim 18 wherein component A is at a concentration in the range of from about 15 to about 275 g/l and component B is at a concentration in the range of from about 0.5 g/l to about 25 g/l.

20. A composition as described in claim 18 wherein component A is at a concentration which is at least about 7 times greater than component B.

* * * * *